(12) United States Patent
Nakai

(10) Patent No.: US 10,103,020 B2
(45) Date of Patent: Oct. 16, 2018

(54) SUBSTRATE PROCESSING APPARATUS

(71) Applicant: SCREEN Holdings Co., Ltd., Kyoto (JP)

(72) Inventor: Hitoshi Nakai, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 164 days.

(21) Appl. No.: 15/125,423

(22) PCT Filed: Mar. 3, 2015

(86) PCT No.: PCT/JP2015/056155
§ 371 (c)(1),
(2) Date: Sep. 12, 2016

(87) PCT Pub. No.: WO2015/137188
PCT Pub. Date: Sep. 17, 2015

(65) Prior Publication Data
US 2017/0098538 A1    Apr. 6, 2017

(30) Foreign Application Priority Data
Mar. 13, 2014   (JP) ................................ 2014-049634

(51) Int. Cl.
*H01L 21/02* (2006.01)
*H01L 21/67* (2006.01)
(Continued)

(52) U.S. Cl.
CPC ........ *H01L 21/02052* (2013.01); *B08B 3/041* (2013.01); *B08B 3/08* (2013.01);
(Continued)

(58) Field of Classification Search
CPC ............................................... H01L 21/02052
See application file for complete search history.

(56) References Cited

U.S. PATENT DOCUMENTS

| 2004/0187896 A1 | 9/2004 | Konishi et al. ................. 134/33 |
| 2007/0240824 A1 | 10/2007 | Kaneko et al. ............ 156/345.11 |

(Continued)

FOREIGN PATENT DOCUMENTS

| CN | 101060070 A | 10/2007 |
| CN | 201140029 Y | 10/2008 |

(Continued)

OTHER PUBLICATIONS

International Search Report dated May 26, 2015 in corresponding PCT International Application No. PCT/JP2015/056155.

(Continued)

*Primary Examiner* — Jason Ko
(74) *Attorney, Agent, or Firm* — Ostrolenk Faber LLP

(57) ABSTRACT

A substrate processing apparatus includes a substrate holding part, a substrate rotating mechanism, a processing liquid supply part for supplying a processing liquid onto the substrate, a cup part for receiving the processing liquid spattering from the substrate being rotated, by its inner peripheral surface, a top plate disposed above the substrate, and a liquid film forming part for forming a rotating liquid film which rotates in the same direction as the substrate does, on the inner peripheral surface of the cup part, by supplying a liquid onto an upper surface of the top plate rotating in the same direction as the substrate rotates, in parallel with a processing of the substrate with the processing liquid. It is possible to prevent droplets caused by collision of the processing liquid spattering from the substrate against the cup part from being deposited on the substrate.

17 Claims, 4 Drawing Sheets

(51) Int. Cl.

| | | |
|---|---|---|
| *B08B 3/04* | (2006.01) | |
| *B08B 3/08* | (2006.01) | |
| *B08B 11/02* | (2006.01) | |
| *H01L 21/687* | (2006.01) | |
| *B08B 3/10* | (2006.01) | |
| *C11D 11/00* | (2006.01) | |

(52) U.S. Cl.
CPC ............... *B08B 3/10* (2013.01); *B08B 11/02* (2013.01); *C11D 11/0047* (2013.01); *H01L 21/67051* (2013.01); *H01L 21/68764* (2013.01)

(56) References Cited

U.S. PATENT DOCUMENTS

| | | | |
|---|---|---|---|
| 2008/0173333 A1 | 7/2008 | Nanba et al. | 134/30 |
| 2011/0240067 A1* | 10/2011 | Kishimoto | H01L 21/02087 |
| | | | 134/33 |
| 2013/0014786 A1 | 1/2013 | Ito et al. | 134/34 |
| 2013/0260574 A1 | 10/2013 | Masuhara et al. | 438/782 |
| 2014/0051258 A1 | 2/2014 | Izumoto et al. | 438/748 |
| 2014/0060423 A1 | 3/2014 | Nakai et al. | 118/50 |
| 2014/0227883 A1 | 8/2014 | Izumoto et al. | 438/745 |
| 2014/0273498 A1 | 9/2014 | Kobayashi et al. | 438/745 |
| 2014/0290703 A1 | 10/2014 | Kobayashi et al. | 134/33 |

FOREIGN PATENT DOCUMENTS

| | | |
|---|---|---|
| JP | 2003-045838 | 2/2003 |
| JP | 2004-319990 A | 11/2004 |
| JP | 2009-214052 | 9/2009 |
| JP | 2011-086826 | 4/2011 |
| JP | 2011-181588 | 9/2011 |
| JP | 2013-021183 | 1/2013 |
| JP | 2013-207265 | 10/2013 |
| JP | 2014-067778 | 4/2014 |
| JP | 2014-067780 | 4/2014 |
| JP | 2014-154858 | 8/2014 |
| JP | 2014-157901 | 8/2014 |
| JP | 2014-179489 | 9/2014 |
| JP | 2014-179490 | 9/2014 |
| JP | 2014-194965 | 10/2014 |
| JP | 2016-063049 | 4/2016 |
| KR | 10-2008-0036542 | 4/2008 |
| TW | 201351538 | 12/2013 |
| TW | 201409593 | 3/2014 |

OTHER PUBLICATIONS

Written Opinion dated May 26, 2015 in corresponding PCT International Application No. PCT/JP2015/056155.
Notification Concerning Transmittaal of International Preliminary Report on Patentability including PCT/IB/373 and PCT/ISA/237 (in Japanese) dated Sep. 22, 2016.
Notification of Transmittal of Translation of the International Preliminary Report on Patentability including PCT/IB/373 and PCT/ISA/237 (in English) dated Sep. 22, 2016.

* cited by examiner

SUBSTRATE PROCESSING APPARATUS

CROSS-REFERENCE TO RELATED APPLICATIONS

The present application is a 35 U.S.C. §§ 371 national phase conversion of PCT/JP2015/056155, filed Mar. 3, 2015, which claims priority to Japanese Patent Application No. 2014-049634, filed Mar. 13, 2014, the contents of both of which are incorporated herein by reference. The PCT International Application was published in the Japanese language.

TECHNICAL FIELD

The present invention relates to a substrate processing apparatus which processes a substrate.

BACKGROUND ART

In a process of manufacturing a semiconductor substrate (hereinafter, referred to simply as a "substrate"), conventionally, substrate processing apparatuses have been used for supplying a processing liquid to a substrate being rotated and performing various processings on the substrate. In such a substrate processing apparatus, a cup part is sometimes provided around the substrate to receive a processing liquid and the like spattering from the substrate by centrifugal force.

In an apparatus for processing a semiconductor substrate disclosed in Japanese Patent Application Laid-Open No. 2011-181588 (Document 1), a processing fluid is injected from a nozzle toward an upper surface of a substrate being rotated and unnecessary substances on the substrate are thereby removed. Around the substrate, provided is a spatter guard cover. At an upper portion inside the spatter guard cover, provided is an annular shower header, and with a liquid jetted from the shower header, a liquid film is formed on an inner surface of the spatter guard cover. Since the unnecessary substances removed from the substrate are rinsed out by the liquid film before being deposited on the spatter guard cover, this prevents contamination of the spatter guard cover with the unnecessary substances.

In a coating apparatus disclosed in Japanese Patent Application Laid-Open No. 2009-214052 (Document 2), a resist liquid is supplied onto a center portion of an upper surface of a substrate being rotated and the upper surface of the substrate is thereby coated with the resist liquid. Around the substrate, provided is a cup. Inside the cup, provided is an annular mist supply nozzle, and by spraying a mist from the mist supply nozzle toward an inner surface of the cup, a liquid film is formed on the inner surface of the cup. The mist spattering from the substrate by centrifugal force comes into contact with the liquid film and is thereby adsorbed by the liquid film.

Also in a liquid processing apparatus disclosed in Japanese Patent Application Laid-Open No. 2011-86826 (Document 3), a resist liquid is supplied onto a center portion of an upper surface of a substrate being rotated and the upper surface of the substrate is thereby coated with the resist liquid. Around the substrate, provided is an outer cup. A cleaning solution is discharged while going down along the inner surface of the outer cup, and a liquid film of the cleaning solution is thereby formed on the inner surface of the outer cup. The resist spattering from the substrate by centrifugal force is captured by the liquid film of the cleaning solution.

On the other hand, in a substrate processing apparatus disclosed in Japanese Patent Application Laid-Open No. 2003-45838 (Document 4), a processing liquid is supplied onto a center portion of an upper surface of a substrate being rotated and a processing is thereby performed on the substrate. Around the substrate, provided is a splash guard. Further, when the processing is performed on the substrate, a cutoff plate facing the upper surface of the substrate is disposed at a position in proximity to the upper surface of the substrate. The processing liquid spattering from the substrate is received by the splash guard and the cutoff plate. A mist of the processing liquid caused by collision of the processing liquid against the substrate is deposited on an upper surface of the cutoff plate and the like. Then, when the processing on a predetermined number of substrates is ended, the cutoff plate escapes to an escape position above the substrate and the splash guard, and the cutoff plate is cleaned at the escape position. Cleaning of the upper surface of the cutoff plate is performed by supplying a cleaning solution onto the upper surface of the cutoff plate being rotated at the escape position.

In the substrate processing apparatuses disclosed in the Documents 1 to 3, the processing liquid spattering from the substrate into the surroundings by centrifugal force goes through the liquid film formed on the inner surface of the cup part and collides against the inner surface of the cup part. The droplets caused by the collision of the processing liquid against the liquid film on the inner surface of the cup part may fly inward in a radial direction from the cup part at an angle in accordance with an incident angle of the processing liquid to the liquid film and be deposited onto the substrate.

SUMMARY OF INVENTION

The present invention is intended for a substrate processing apparatus for processing a substrate, and it is an object of the present invention to prevent droplets caused by collision of a processing liquid against a cup part from being deposited on the substrate.

The substrate processing apparatus according to the present invention includes: a substrate holding part for holding a substrate in a horizontal state; a substrate rotating mechanism for rotating the substrate holding part together with the substrate about a central axis oriented in a vertical direction; a processing liquid supply part for supplying a processing liquid onto the substrate; a cup part disposed around the substrate holding part, for receiving the processing liquid spattering from the substrate being rotated, by its inner peripheral surface; a plate having an annular disk-like shape about the central axis, disposed above the substrate, extending toward the outside of an outer peripheral edge of the substrate in a radial direction about the central axis; and a liquid film forming part for forming a rotating liquid film which rotates in the same direction as the substrate does, on the inner peripheral surface of the cup part, by supplying a liquid onto an upper surface of the plate rotating in the same direction as the substrate rotates about the central axis, to thereby supply the liquid from the upper surface of the plate to the inner peripheral surface of the cup part by centrifugal force, in parallel with a processing of the substrate with the processing liquid.

By the substrate processing apparatus, it is possible to prevent droplets caused by collision of the processing liquid against the cup part from being deposited on the substrate.

In a preferred embodiment of the present invention, the substrate processing apparatus further includes a position fixing member for fixing a relative position of the plate relative to the substrate holding part in a circumferential direction about the central axis during rotation of the plate, and in the substrate processing apparatus of the present invention, the plate is rotated together with the substrate holding part by the substrate rotating mechanism.

In another preferred embodiment of the present invention, the liquid film forming part includes a plurality of discharge ports arranged in a circumferential direction about the central axis, each of which discharges the liquid toward the upper surface of the plate.

In still another preferred embodiment of the present invention, the liquid supplied from the liquid film forming part to the plate goes outward in a radial direction about the central axis as the liquid comes nearer to the plate.

In yet another preferred embodiment of the present invention, the inner peripheral surface of the cup part has a lyophilic property to the liquid supplied from the liquid film forming part.

In a further preferred embodiment of the present invention, the upper surface of the plate has a lyophilic property to the liquid supplied from the liquid film forming part.

In a still further preferred embodiment of the present invention, the processing liquid supplied from the processing liquid supply part and the liquid supplied from the liquid film forming part are liquids of the same kind.

These and other objects, features, aspects and advantages of the present invention will become more apparent from the following detailed description of the present invention when taken in conjunction with the accompanying drawings.

DESCRIPTION OF EMBODIMENTS

Figure 1:
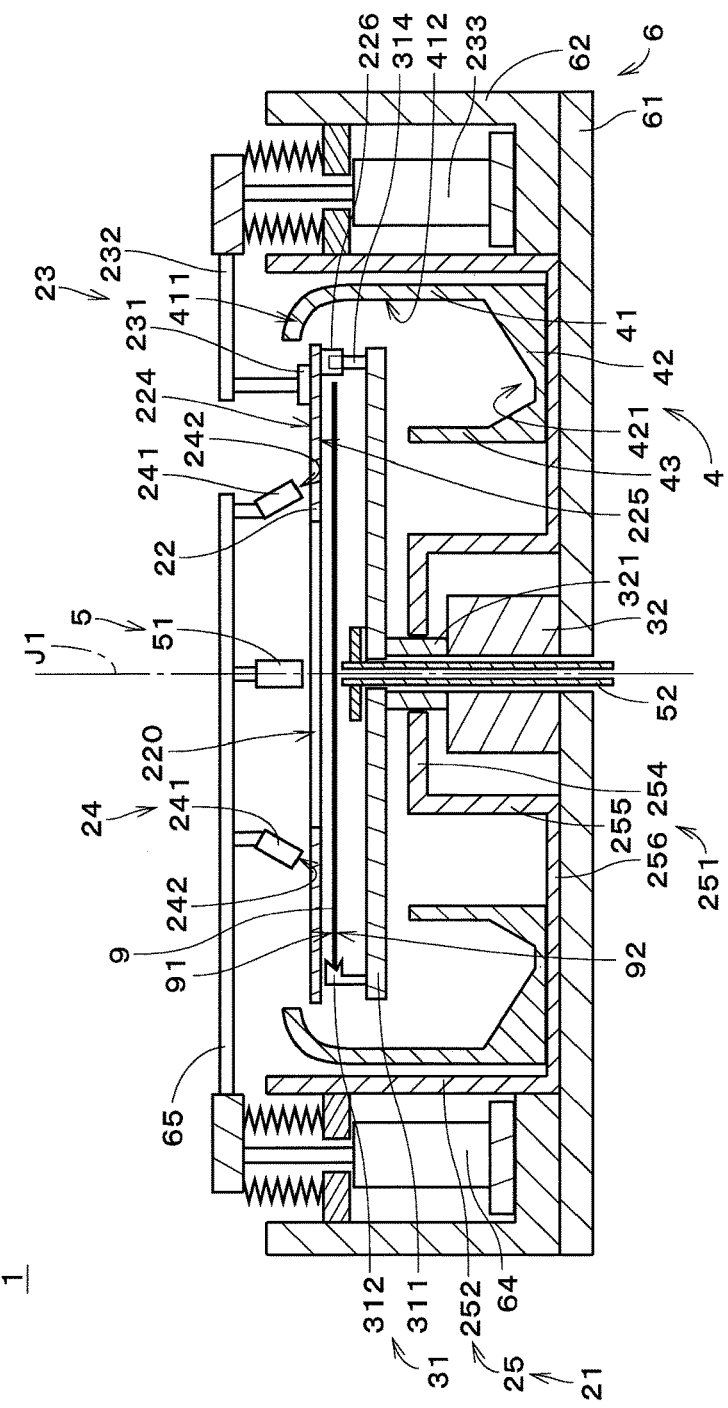
FIG. 1 is a cross section showing a substrate processing apparatus in accordance with one preferred embodiment.

FIG. 1 is a cross section showing a substrate processing apparatus 1 in accordance with one preferred embodiment of the present invention. The substrate processing apparatus 1 is a single-substrate processing apparatus which supplies a processing liquid onto a semiconductor substrate 9 (hereinafter, referred to simply as a "substrate 9") having a substantially disk-like shape and thereby processes the substrates 9 one by one. In the substrate processing apparatus 1, deionized water (DIW), an acid chemical liquid, an alkaline chemical liquid, or the like is used as the processing liquid, and various processings such as cleaning and the like on the substrate 9 are performed. In FIG. 1, hatching of the cross sections of some constituent elements in the substrate processing apparatus 1 is omitted (the same applies to other cross-sectional views).

The substrate processing apparatus 1 includes a chamber 21, a plate 22, a plate moving mechanism 23, a liquid film forming part 24, a substrate holding part 31, a substrate rotating mechanism 32, a cup part 4, a processing liquid supply part 5, and a housing 6.

Inside the housing 6, accommodated are the chamber 21, the plate, 22, the plate moving mechanism 23, the liquid film forming part 24, the substrate holding part 31, the substrate rotating mechanism 32, the cup part 4, and the processing liquid supply part 5. The housing 6 includes a housing bottom 61 and a housing sidewall 62. The housing bottom 61 supports the chamber 21 and the like from below. The housing sidewall 62 surrounds the chamber 21 and the like.

The chamber 21 includes a chamber body 25. The chamber 21 has a substantially cylindrical shape about a central axis J1. The chamber body 25 includes a chamber bottom 251 and a chamber sidewall 252. The chamber bottom 251 includes a center portion 254, a sidewall portion 255, an outer peripheral portion 256. The center portion 254 has a substantially annular disk-like shape about the central axis J1. The sidewall portion 255 has a substantially cylindrical shape about the central axis J1, extending downward from an outer edge portion of the center portion 254. The outer peripheral portion 256 has a substantially annular disk-like shape about the central axis J1, extending from a lower end of the sidewall portion 255 outward in a radial direction about the central axis J1 (hereinafter, referred to simply as "in a radial direction"). The chamber sidewall 252 has a substantially cylindrical shape about the central axis J1. The chamber sidewall 252 projects upward from an outer edge portion of the chamber bottom 251.

As shown in FIG. 1, the substrate holding part 31 holds the substrate 9 inside the cup part 4 in a horizontal state. In other words, the substrate 9 is held by the substrate holding part 31 with its upper surface 91 on which a fine pattern is formed, directed upward perpendicular to the central axis J1. The substrate holding part 31 includes a base portion 311 and a plurality of chucks 312. The base portion 311 has a substantially disk-like shape perpendicular to the central axis J1 and also has an opening at the center. The plurality of (e.g., three) chucks 312 are fixed on an upper surface of the base portion 311. The plurality of chucks 312 are arranged at almost regular angular intervals in a circumferential direction about the central axis J1 (hereinafter, referred to simply as "in a circumferential direction"). The outer edge portion of the substrate 9 is held above the base portion 311 by the plurality of chucks 312.

The substrate rotating mechanism 32 is disposed below the center portion 254 of the chamber bottom 251. The substrate rotating mechanism 32 is, for example, a shaft rotation type electric motor. A rotation shaft 321 of the substrate rotating mechanism 32 goes through the center portion 254 of the chamber bottom 251 and extends toward the inside of the chamber 21. The rotation shaft 321 has a substantially cylindrical shape about the central axis J1. At a tip portion of the rotation shaft 321, the base portion 311 of the substrate holding part 31 is fixed. Between the rotation shaft 321 and the center portion 254 of the chamber bottom 251, provided is a seal for preventing passage of gas and/or liquid. With rotation of the rotation shaft 321, the substrate holding part 31 is rotated together with the substrate 9 about the central axis J1.

Figure 2:
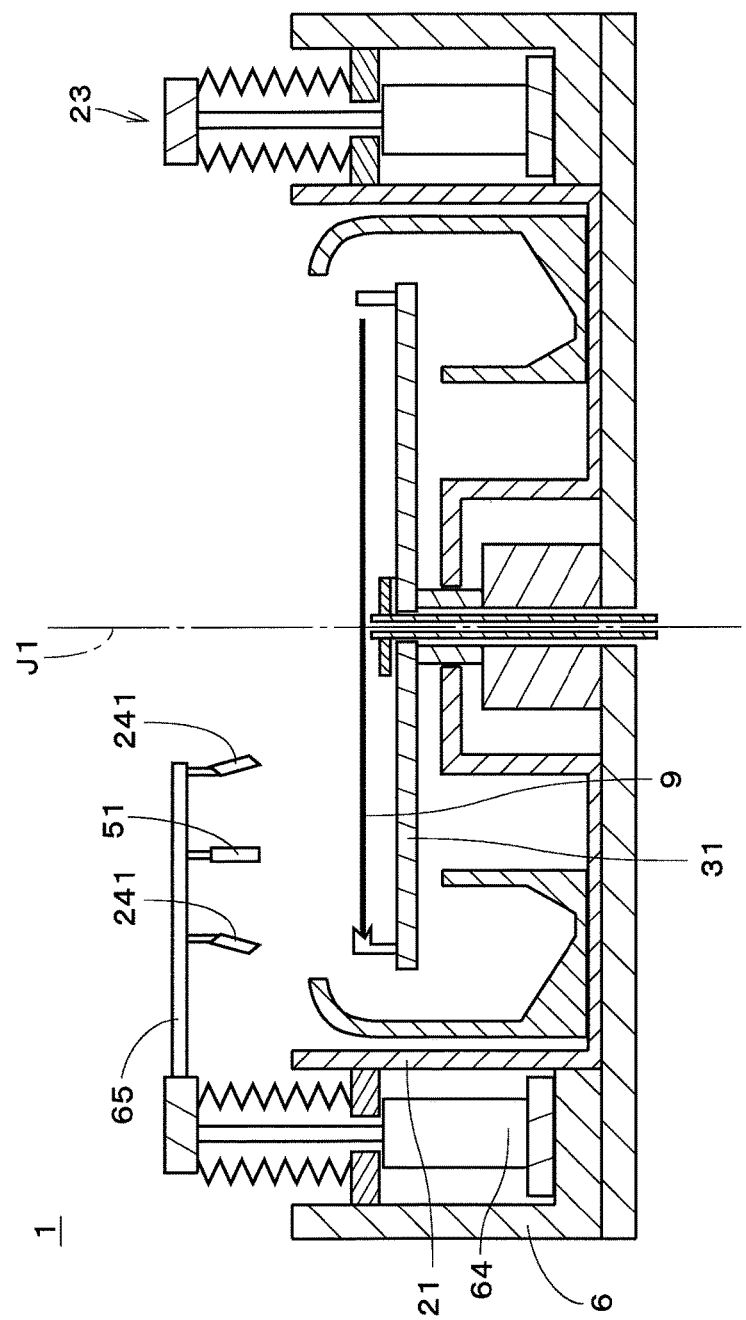
FIG. 2 is a cross section showing the substrate processing apparatus.

The plate moving mechanism 23 includes a vacuum adsorption pad 231, an arm 232, and an up-and-down moving and turning mechanism 233. The up-and-down moving and turning mechanism 233 is provided on a side of the cup part 4. One end portion of the arm 232 is fixed to the up-and-down moving and turning mechanism 233. At the other end portion of the arm 232, attached is the vacuum adsorption pad 231, facing downward. The up-and-down moving and turning mechanism 233 moves up and down the arm 232 and turns the arm 232 horizontally. The vacuum adsorption pad 231 is thereby moved between the inside and the outside of the cup part 4. The vacuum adsorption pad 231 adsorbs an upper surface of the plate 22, to thereby hold the plate 22. As shown in FIG. 1, the plate moving mechanism 23 holds the plate 22 by the vacuum adsorption pad 231 and attaches the plate 22 to the substrate holding part 31 from above. Further, as shown in FIG. 2, the plate moving mechanism 23 detaches the plate 22 from the substrate holding part 31 and causes the plate 22 to escape from above the chamber 21 to the side of the chamber 21. In the following description, the position of the plate 22 shown in FIG. 1 is referred to as a "processing position". Furthermore, as shown in FIG. 2, the position (not shown) of the plate 22 after escaping from above the substrate holding part 31 to the side thereof is referred to as an "escape position".

The plate 22 shown in FIG. 1 has a substantially annular disk-like shape about the central axis J1. The plate 22 is disposed above the substrate holding part 31 and the substrate 9 and attached to the substrate holding part 31. In the following description, the plate 22 is referred to as a "top plate 22". The top plate 22 has an opening 220 at the center. An upper surface 224 and a lower surface 225 of the top plate 22 are substantially perpendicular to the central axis J1. The upper surface 224 of the top plate 22 has a lyophilic property to a liquid supplied from the liquid film forming part 24. When the liquid is deionized water or the like, the upper surface 224 of the top plate 22 is hydrophilic. The top plate 22 is formed of, for example, a ceramic material, or formed by ceramic coating on a base material of metal or resin. The lower surface 225 of the top plate 22 faces the upper surface 91 of the substrate 9 held by the substrate holding part 31 in a vertical direction. The diameter of the top plate 22 is larger than that of the substrate 9 and larger than that of the base portion 311 (described later) of the substrate holding part 31. In other words, the top plate 22 extends toward the outside of an outer peripheral edge of the substrate 9 and an outer peripheral edge of the base portion 311 of the substrate holding part 31 along the entire circumference in the radial direction.

On an upper surface of the base portion 311 of the substrate holding part 31, provided are a plurality of first engagement parts 314 in the circumferential direction. Each of the first engagement parts 314 has a substantially columnar shape projecting upward. On a lower surface of the top plate 22, provided are a plurality of second engagement parts 226 in the circumferential direction. At a lower portion of each of the second engagement parts 226, provided is a recessed portion which is recessed upward.

As shown in FIG. 1, in a state where the top plate 22 is positioned at the processing position, the first engagement part 314 fits into the recessed portion at the lower portion of the second engagement part 226. The top plate 22 is thereby engaged with the base portion 311 of the substrate holding part 31 in the circumferential direction. In other words, with the first engagement parts 314 and the second engagement parts 226, a relative position of the top plate 22 relative to the substrate holding part 31 in a rotation direction is controlled.

In the state where the top plate 22 is positioned at the processing position, the top plate 22 is supported by the base portion 311 of the substrate holding part 31 with the first engagement parts 314 and the second engagement parts 226 interposed therebetween. The top plate 22 is thereby rotated together with the substrate holding part 31 and the substrate 9 by the substrate rotating mechanism 32. When the top plate 22 is rotated, the vacuum adsorption pad 231 of the plate moving mechanism 23 is separated from the top plate 22. The first engagement parts 314 and the second engagement parts 226 are position fixing members for fixing the relative position of the top plate 22 relative to the substrate holding part 31 in the circumferential direction when the top plate 22 is rotated.

The processing liquid supply part 5 includes an upper nozzle 51, a lower nozzle 52, an up-and-down moving and turning mechanism 64, and an arm 65. The up-and-down moving and turning mechanism 64 is provided on a side of the cup part 4. One end portion of the arm 65 is fixed to the up-and-down moving and turning mechanism 64. At the other end portion of the arm 65, attached is the upper nozzle 51. The up-and-down moving and turning mechanism 64 moves up and down the arm 65 and turns the arm 65 horizontally. The upper nozzle 51 is thereby moved between above a center portion of the substrate 9 and the outside of the cup part 4 (i.e., the side of the cup part 4). The up-and-down moving and turning mechanism 64 and the arm 65 serves as a nozzle moving mechanism for moving the upper nozzle 51. The upper nozzle 51 is connected to a processing liquid supply source (not shown) provided outside the housing 6. In a state where the upper nozzle 51 is positioned above the center portion of the substrate 9, a lower end of the upper nozzle 51 faces the center portion of the upper surface 91 of the substrate 9 with the opening 220 of the top plate 22 interposed therebetween above the top plate 22. The processing liquid supplied from the processing liquid supply source to the upper nozzle 51 is supplied from the lower end of the upper nozzle 51 toward the center portion of the upper surface 91 of the substrate 9.

The lower nozzle 52 is disposed inside the rotation shaft 321 of the substrate rotating mechanism 32 and projects out upward from the base portion 311 through an opening positioned at the center of the base portion 311 of the substrate holding part 31. The lower nozzle 52 is not in contact with the rotation shaft 321 and is not rotated when the rotation shaft 321 rotates. Between the lower nozzle 52 and the base portion 311, provided is a seal for preventing passage of gas and/or liquid. The lower nozzle 52 is connected to the processing liquid supply source (not shown) provided outside the housing 6. An upper end of the lower nozzle 52 is positioned below the substrate 9 and faces a center portion of a lower surface 92 of the substrate 9. The processing liquid supplied from the processing liquid supply source to the lower nozzle 52 is supplied from the upper end of the lower nozzle 52 toward the center portion of the lower surface 92 of the substrate 9.

The cup part 4 is disposed around the substrate holding part 31 and receives the processing liquid spattering from the substrate 9 being rotated. The cup part 4 includes an outer sidewall 41, a cup bottom 42, and an inner sidewall 43. The outer sidewall 41 has a substantially cylindrical shape about the central axis J1. The outer sidewall 41 is positioned outside the substrate holding part 31 and the substrate 9 in the radial direction. Further, the outer sidewall 41 is positioned outside the top plate 22 positioned at the processing position in the radial direction. At an upper portion of the outer sidewall 41, provided is an eaves portion 411 going inward in the radial direction as it goes upper. The eaves portion 411 has a substantially annular disk-like shape about the central axis J1. The inner diameter of the eaves portion 411 (i.e., the diameter of an upper end edge of the outer sidewall 41) is slightly larger than the diameter of the top plate 22. The top plate 22 is thereby movable between the inside and the outside of the cup part 4 by the plate moving mechanism 23.

An inner peripheral surface 412 of the outer sidewall 41 is a substantially cylindrical surface about the central axis J1. At the eaves portion 411, the inner peripheral surface 412 is a sloped surface going downward as it goes outward in the radial direction. The inner peripheral surface 412 of the outer sidewall 41 faces an outer peripheral edge of the top plate 22 positioned at the processing position and the outer peripheral edge of the substrate 9 in the radial direction. The cup part 4 receives the processing liquid spattering from the substrate 9 being rotated by the inner peripheral surface 412. Like the upper surface 224 of the top plate 22, the inner peripheral surface 412 of the outer sidewall 41 has a lyophilic property to the liquid supplied from the liquid film forming part 24. When the liquid is deionized water or the like, the inner peripheral surface 412 is hydrophilic. The cup part 4 is formed of, for example, a ceramic material, or formed by ceramic coating on a base material of metal or resin.

The cup bottom 42 has a substantially annular shape about the central axis J1. The cup bottom 42 extends inward from a lower end portion of the outer sidewall 41 in the radial direction. The inner sidewall 43 has a substantially cylindrical shape about the central axis J1. The inner sidewall 43 is positioned inside the outer sidewall 41 in the radial direction, extending upward from an inner edge portion of the cup bottom 42. At an upper portion of the cup bottom 42, provided is a recessed portion 421 which is recessed downward. The width of the recessed portion 421 in the radial direction gradually decreases as it goes downward. At a lower end portion of the recessed portion 421, provided is a not-shown exhaust port. To the exhaust port, connected are a gas-liquid separating device and a gas exhaust facility which are not shown. The liquid such as the processing liquid or the like received by the cup part 4 is discharged outside the housing 6 through the exhaust port. Further, by exhausting gas from the space inside the cup part 4 through the exhaust port during the processing using the processing liquid, downflow is caused inside the cup part 4 and a micro mist of the processing liquid generated in the cup part 4 can be discharged outside the cup part 4.

The liquid film forming part 24 includes a plurality of (e.g., two) liquid film forming nozzles 241. In the present preferred embodiment, two liquid film forming nozzles 241 are attached to the arm 65 of the nozzle moving mechanism, like the upper nozzle 51. In the present preferred embodiment, two liquid film forming nozzles 241 are attached to the substantially-linear arm 65 with the upper nozzle 51 sandwiched therebetween. In other words, one liquid film forming nozzle 241 is positioned on the side of a tip of the arm 65 as viewed from the upper nozzle 51 and the other liquid film forming nozzle 241 is positioned on the side of a base of the arm 65 as viewed from the upper nozzle 51. In a state where the upper nozzle 51 is positioned to face the center portion of the upper surface 91 of the substrate 9 at a position where the processing liquid can be supplied to the center portion, the two liquid film forming nozzles 241 are positioned inside an outer edge of the top plate 22 in the radial direction above the top plate 22. At a lower end of each of the liquid film forming nozzles 241, provided is a discharge port 242 for discharging a liquid toward the upper surface 224 of the top plate 22. In other words, the liquid film forming part 24 includes a plurality of discharge ports 242 arranged in the circumferential direction about the central axis J1, and the plurality of discharge ports 242 discharge the liquid toward the upper surface 224 of the top plate 22. Further, the number of liquid film forming nozzles 241 provided in the substrate processing apparatus 1 may be one, or three or more. There may be a configuration, for example, where an annular frame having a diameter almost equal to the diameter of the opening 220 of the top plate 22 is attached to the arm 65 and eight liquid film forming nozzles 241 disposed at substantially regular angular intervals in the circumferential direction are attached to the frame.

Each of the liquid film forming nozzles 241 extends outward in the radial direction as it goes downward. In other words, each liquid film forming nozzle 241 is attached to the arm 65 in an inclined attitude outward and downward in the radial direction. The liquid discharged from the discharge port 242 of each liquid film forming nozzle 241 also goes outward in the radial direction as it goes downward. In other words, the liquid supplied from the liquid film forming part 24 onto the upper surface 224 of the top plate 22 goes outward in the radial direction as it comes closer to the top plate 22. The liquid from the discharge port 242 is discharged, for example, sequentially in a columnar form. In the exemplary case of FIG. 1, the liquid supplied from the liquid film forming part 24 to the top plate 22 is the same kind of liquid as the processing liquid supplied from the processing liquid supply part 5 to the substrate 9. The liquid supplied from the liquid film forming part 24 is, for example, deionized water.

Figure 3:
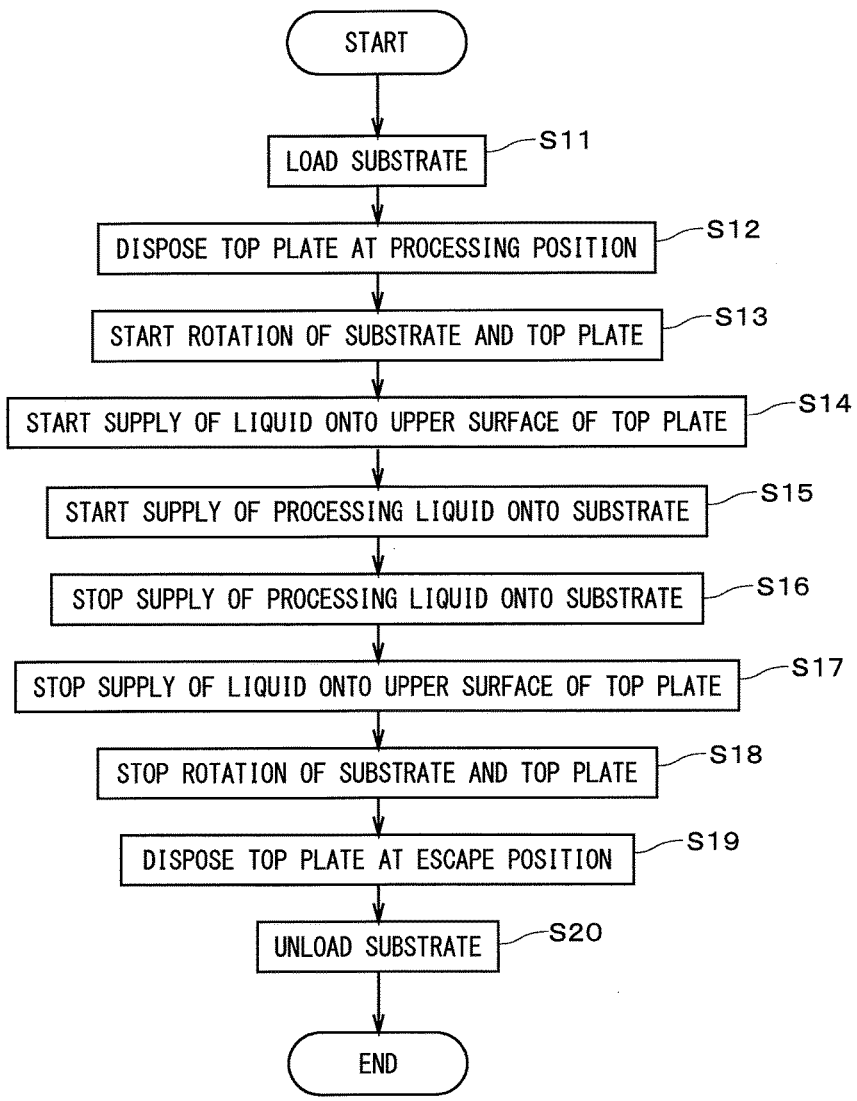
FIG. 3 is a flowchart showing an operation flow for processing a substrate.

FIG. 3 is a flowchart showing an operation flow for processing the substrate 9 in the substrate processing apparatus 1. In order to perform a processing on the substrate 9 in the substrate processing apparatus 1, first, in a state where the arm 65 and the top plate 22 escape from above the substrate holding part 31 to the side thereof (see FIG. 2), the substrate 9 being held by a not-shown robot hand or the like is transferred into the housing 6 and held by the substrate holding part 31 (Step S11). In FIG. 2, though it is seen as if the arm 65 is positioned partially over the substrate holding part 31, the arm 65 is actually caused to escape to behind the substrate holding part 31 in the figure by the up-and-down moving and turning mechanism 64.

When the substrate 9 is held, as shown in FIG. 1, the top plate 22 is adsorbed and held by the vacuum adsorption pad 231 of the plate moving mechanism 23 and moved while turning toward above the substrate holding part 31. Then, the top plate 22 goes down toward the substrate holding part 31 and is coupled with the substrate holding part 31 to be positioned at the processing position. After the top plate 22 and the substrate holding part 31 are coupled with each other, the adsorption of the plate moving mechanism 23 by the vacuum adsorption pad 231 is released, and the arm 232 turns to escape from above the substrate 9 (Step S12). The upper surface 224 of the top plate 22 is thereby positioned below the upper end edge of the outer sidewall 41 of the cup part 4, i.e., the upper end edge of the eaves portion 411.

Next, the substrate rotating mechanism 32 is driven to start rotation of the substrate 9, the substrate holding part 31, and the top plate 22 (Step S13). The respective rotation speeds of the substrate 9, the substrate holding part 31, and the top plate 22 are equal to one another and the respective rotation directions are the same. Subsequently, the up-and-down moving and turning mechanism 64 moves the arm 65 to above the substrate holding part 31. The upper nozzle 51 is thereby caused to be disposed above the center portion of the substrate 9 and the two liquid film forming nozzles 241 is thereby caused to be disposed above the top plate 22. Then, the plurality of discharge ports 242 of the liquid film forming part 24 start supplying the above-described liquid toward the upper surface 224 of the top plate 22 being rotated about the central axis J1 (Step S14).

Figure 4:
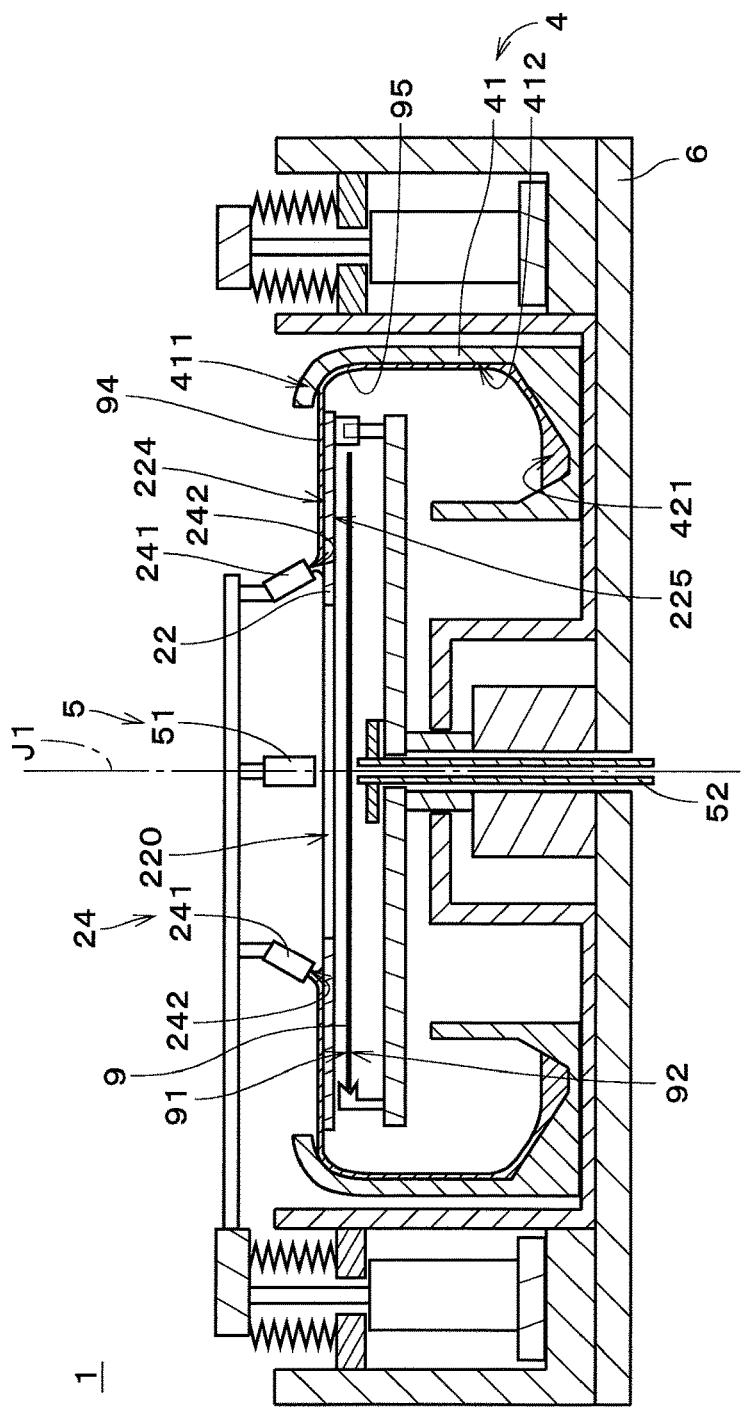
FIG. 4 is a cross section showing the substrate processing apparatus.

FIG. 4 is a cross section showing the supply of the liquid from the liquid film forming part 24. As shown in FIG. 4, on the upper surface 224 of the top plate 22 being rotated, the liquid 94 from the liquid film forming part 24 goes toward the front side in the rotation direction while going outward in the radial direction by centrifugal force. The liquid 94 spreads over the upper surface 224 of the top plate 22 and covers almost entirely a range in the upper surface 224 outside a position (liquid-reaching position) which the liquid discharged from each of the liquid film forming nozzles 241 reaches, in the radial direction. Further, in a case where the liquid 94 supplied onto the top plate 22, which also spreads inside the liquid-reaching position in the radial direction in some degree, may fall from the opening 220 of the top plate 22, by providing a slight rising wall at an edge portion of the opening 220 of the top plate 22, the fall of the liquid 94 can be prevented.

The liquid 94 reaching the outer peripheral edge of the top plate 22 bursts from the outer peripheral edge outward in the radial direction to spread along the entire circumference of the outer peripheral edge, and reaches the inner peripheral surface 412 of the outer sidewall 41 of the cup part 4. In other words, the liquid 94 is supplied from the upper surface 224 of the top plate 22 to the inner peripheral surface 412 of the outer sidewall 41 of the cup part 4.

The liquid 94 supplied to the inner peripheral surface 412 of the outer sidewall 41 moves downward by the gravity while moving on the inner peripheral surface 412 toward the front side in the rotation direction of the top plate 22. In other words, on the inner peripheral surface 412, the liquid 94 flows diagonally downward toward the front side in the rotation direction of the top plate 22. The liquid 94 spreads over the inner peripheral surface 412 of the outer sidewall 41 and covers almost entirely the range in the inner peripheral surface 412, not larger than the top plate 22. Specifically, the liquid 94 is supplied to a substantially center portion of the eaves portion 411 in the inner peripheral surface 412 of the outer sidewall 41 in a vertical direction and covers almost entirely the inner peripheral surface 412 below the center portion. The inner diameter of the eaves portion 411 is only slightly larger than the diameter of the top plate 22, and the liquid 94 reaches the inner peripheral surface 412 of the outer sidewall 41 without losing the vector moving in the rotation direction, which is given by the top plate 22. A rotating liquid film 95 which rotates in the same direction as the top plate 22 and the substrate 9 rotate is thereby formed on the inner peripheral surface 412 of the cup part 4.

As described above, the diameter of the top plate 22 is slightly smaller than that of the upper end edge of the eaves portion 411, and the outer peripheral edge of the top plate 22 is in proximity to the inner peripheral surface 412 of the eaves portion 411. Therefore, it is possible to prevent the flow of the liquid 94 from being disordered while the liquid 94 moves from the outer peripheral edge of the top plate 22 to the inner peripheral surface 412. As a result, it is possible to easily form the rotating liquid film 95 on the inner peripheral surface 412 of the outer sidewall 41. Further, it is also possible to improve the uniformity of the film thickness of the rotating liquid film 95.

After the rotating liquid film 95 is formed, the upper nozzle 51 of the processing liquid supply part 5 starts supplying the processing liquid onto the upper surface 91 of the substrate 9 being rotated (Step S15). The processing liquid supplied sequentially onto the center portion of the upper surface 91 of the substrate 9 moves outward in the radial direction by centrifugal force. The processing liquid spreads over the upper surface 91 of the substrate 9 to thereby entirely cover the upper surface 91. The processing is thereby performed on the upper surface 91 of the substrate 9. Since the upper surface 91 of the substrate 9 is in proximity to the lower surface 225 of the top plate 22 positioned at the processing position, the processing using the processing liquid on the substrate 9 is performed in a small space between the upper surface 91 of the substrate 9 and the lower surface 225 of the top plate 22. It is thereby possible to prevent diffusion of a processing liquid atmosphere in the space above the substrate 9 and also possible to prevent a decrease of the temperature of the substrate 9 during the processing.

The processing liquid reaching the outer peripheral edge of the substrate 9 spatters from the outer peripheral edge outward in the radial direction and toward the front side in the rotation direction of the substrate 9 and is received by the cup part 4. At that time, the droplets of the processing liquid spattering from the substrate 9 collides against the rotating liquid film 95 formed on the inner peripheral surface 412 of the outer sidewall 41 of the cup part 4. As described above, since the rotating liquid film 95 rotates in the same direction as the substrate 9 does, the droplets caused by the collision against the rotating liquid film 95 are absorbed by the rotating liquid film 95 and carried toward the front side in the rotation direction of the rotating liquid film 95. Further, even when new droplets are caused by the collision of the droplets of the processing liquid from the substrate 9 against the rotating liquid film 95, the new droplets fly from the rotating liquid film 95 at a reflection angle larger than the incident angle of the droplets from the substrate 9 to the rotating liquid film 95, due to the rotation of the rotating liquid film 95. Therefore, it is possible to prevent the new droplets from flying toward the substrate 9 inside in the radial direction. Thus, in the substrate processing apparatus 1, by forming the rotating liquid film 95 on the inner peripheral surface 412 of the cup part 4 in parallel with the processing using the processing liquid on the substrate 9, it is possible to prevent the droplets caused by the collision of the processing liquid spattering from the substrate 9 against the cup part 4 from being deposited on the substrate 9.

The processing liquid received by the cup part 4 and the liquid 94 supplied from the top plate 22 to the cup part 4 are guided to the recessed portion 421 and discharged outside the housing 6 through the above-described exhaust port. The liquid discharged from the cup part 4 (i.e., the mixed solution of the processing liquid and the liquid 94 used for forming the rotating liquid film 95) is collected as necessary, and after removing impurities and the like, the liquid is reused. In the substrate processing apparatus 1, as described above, the liquid 94 supplied from the liquid film forming part 24 to the top plate 22 and the processing liquid supplied from the processing liquid supply part 5 onto the substrate 9 are liquids of the same kind. For this reason, in collecting and reusing the processing liquid, it is possible to increase the collection efficiency of the processing liquid.

When a predetermined time elapses after the start of supply of the processing liquid from the upper nozzle 51, the supply of the processing liquid from the upper nozzle 51 onto the substrate 9 is stopped (Step S16). The processing liquid remaining on the substrate 9 spatters toward the cup part 4 by rotation of the substrate 9, the processing liquid is removed from the substrate 9. Also when the processing liquid is removed from the substrate 9, the supply of the liquid 94 from the liquid film forming part 24 onto the upper surface 224 of the top plate 22 continues and the rotating liquid film 95 exists on the inner peripheral surface 412 of the cup part 4. Therefore, like in the above case, it is possible to prevent the droplets caused by the collision of the processing liquid spattering from the substrate 9 against the cup part 4 from being deposited on the substrate 9. After the processing liquid is removed from the substrate 9, the supply of the liquid 94 from the liquid film forming part 24 onto the upper surface 224 of the top plate 22 is stopped (Step S17).

Further, in the substrate processing apparatus 1, between Steps S16 and S17, another processing liquid may be supplied from the processing liquid supply part 5 onto the substrate 9 and another processing different from the above one may be performed on the substrate 9. Even in this case, since the rotating liquid film 95 is formed on the inner peripheral surface 412 of the cup part 4, it is possible to prevent the droplets caused by the collision of another processing liquid spattering from the substrate 9 against the cup part 4 from being deposited on the substrate 9.

Furthermore, in the substrate processing apparatus 1, also in a case where the processing is performed by using the processing liquid supplied from the lower nozzle 52 onto the center portion of the lower surface 92 of the substrate 9, similarly, the liquid 94 is supplied from the liquid film forming part 24 onto the upper surface 224 of the top plate 22 being rotated, in parallel with the processing using the processing liquid, the rotating liquid film 95 is formed on the inner peripheral surface 412 of the cup part 4. It is therefore possible to prevent the droplets caused by the collision of the processing liquid spattering from the substrate 9 against the cup part 4 from being deposited on the substrate 9.

When the processing on the substrate 9 and the supply of the liquid 94 from the liquid film forming part 24 are ended, the rotations of the substrate 9, the substrate holding part 31, and the top plate 22 are stopped (Step S18). Subsequently, the upper nozzle 51 and the liquid film forming nozzle 241 escape from above the substrate 9 (see FIG. 2). Then, as shown in FIG. 1, the vacuum adsorption pad 231 of the plate moving mechanism 23 moves while turning toward above the top plate 22 and goes down, to thereby adsorb and hold the top plate 22. Next, the vacuum adsorption pad 231 goes up and moves while turning, and the top plate 22 is thereby moved from above the substrate 9 to the escape position (Step S19). After that, the substrate 9 is held by the not-shown robot hand or the like and transferred out of the substrate processing apparatus 1 (Step S20).

As described above, in the substrate processing apparatus 1 of FIG. 1, the relative position of the top plate 22 relative to the substrate holding part 31 in the circumferential direction is fixed by the first engagement parts 314 and the second engagement parts 226, and the top plate 22 is rotated together with the substrate 9 and the substrate holding part 31 by the substrate rotating mechanism 32. For this reason, it is not necessary to provide a mechanism for rotating the top plate 22 separately from the substrate rotating mechanism 32. Therefore, it is possible to simplify the construction of the substrate processing apparatus 1.

Further, the liquid film forming part 24 includes the plurality of discharge ports 242 arranged in the circumferential direction as shown in FIG. 4. Therefore, in the liquid film formed on the top plate 22 with the liquid 94 discharged from the liquid film forming part 24, it is possible to improve the uniformity of the film thickness in the circumferential direction. It is thereby possible to improve the uniformity of the film thickness of the rotating liquid film 95 formed by supplying the liquid film on the cup part 4. As a result, it is possible to prevent the droplets caused by the collision of the processing liquid spattering from the substrate 9 against the cup part 4 from being deposited on the substrate 9 almost uniformly in the circumferential direction. It is preferable that the plurality of discharge ports 242 should be disposed at substantially regular angular intervals in the circumferential direction. It is thereby possible to further improve the uniformity of the film thickness of the liquid film on the top plate 22. As a result, it is possible to further improve the uniformity of the film thickness of the rotating liquid film 95.

As described above, the liquid 94 supplied from the liquid film forming part 24 to the top plate 22 goes outward in the radial direction as it comes closer to the top plate 22. Since the liquid 94 on the top plate 22 moves outward in the radial direction by centrifugal force, it is possible to prevent the liquid 94 discharged from each of the discharge ports 242 of the liquid film forming part 24 toward the top plate 22 from colliding with the liquid 94 moving on the top plate 22. It is thereby possible to prevent the disorder of the flow of the liquid 94 at the liquid-reaching position of the liquid 94, and improve the uniformity of the film thickness of the liquid film on the top plate 22. As a result, it is possible to improve the uniformity of the film thickness of the rotating liquid film 95.

In the substrate processing apparatus 1, the inner peripheral surface 412 of the cup part 4 has a lyophilic property to the liquid 94 supplied from the liquid film forming part 24. For this reason, it is possible to easily form the rotating liquid film 95 on the inner peripheral surface 412 of the cup part 4 and also possible to improve the uniformity of the film thickness of the rotating liquid film 95.

Further, the upper surface 224 of the top plate 22 also has a lyophilic property to the liquid 94 supplied from the liquid film forming part 24. For this reason, it is possible to easily form the liquid film on the upper surface 224 of the top plate 22 and also possible to improve the uniformity of the film thickness of the liquid film. As a result, it is possible to more easily form the rotating liquid film 95 and also possible to further improve the uniformity of the film thickness of the rotating liquid film 95.

In the substrate processing apparatus 1, various modifications can be made.

In the substrate processing apparatus 1 of FIG. 1, position fixing members having various structures may be provided, instead of the first engagement parts 314 and the second engagement parts 226, and by such a position fixing member, the relative position of the top plate 22 relative to the substrate holding part 31 in the circumferential direction may be fixed when the top plate 22 is rotated.

In the liquid film forming part 24 of the substrate processing apparatus 1, the liquid 94 discharged from each discharge port 242 does not necessarily need to go outward in the radial direction as it comes closer to the top plate 22, and for example, the liquid 94 may be discharged from each discharge port 242 downward in the vertical direction (i.e., substantially perpendicular to the upper surface 224 of the top plate 22). Further, the liquid film forming nozzle 241 may be provided so as to be directed toward a downstream side in the rotation direction of the top plate 22 so that the liquid 94 discharged from each discharge port 242 may flow in a direction along the rotation direction of the top plate 22. In the liquid film forming part 24, the number of discharge ports 242 for discharging the liquid 94 may be changed as appropriate. The number of discharge ports 242 may be, for example, one.

The liquid 94 supplied from the liquid film forming part 24 to the top plate 22, i.e., the liquid 94 used for forming the rotating liquid film 95 does not necessarily need to be the same kind of liquid as the processing liquid supplied from the processing liquid supply part 5 to the substrate 9. In a case where the processing liquid used for the processing on the substrate 9 is not collected and discarded, for example, a cheap liquid different from the processing liquid, or a liquid more suitable for forming the rotating liquid film 95 than the processing liquid may be used as the liquid 94. When a liquid having a cleaning effect, such as deionized water, is used as the liquid 94, an effect of cleaning the inner peripheral surface 412 of the cup part 4, i.e., an effect of cup cleaning can be produced as well as the effects of preventing generation of the droplets and preventing deposition of the droplets on the substrate 9.

In the substrate processing apparatus 1, only if the rotating liquid film 95 is appropriately formed, the upper surface 224 of the top plate 22 and the inner peripheral surface 412 of the cup part 4 do not necessarily need to have a lyophilic property to the liquid 94 supplied from the liquid film forming part 24. Further, the upper surface 224 and the lower surface 225 of the top plate 22 do not necessarily need to be perpendicular to the central axis J1, but for example, the upper surface 224 and the lower surface 225 may be sloped surfaces going downward as it goes outward in the radial direction.

The substrate rotating mechanism 32 is not necessarily limited to the shaft rotation type electric motor, but may be a rotation mechanism having any one of various structures. The substrate rotating mechanism 32 may be a hollow motor which rotates the substrate 9 and the substrate holding part 31 in a floating state.

The chamber 21 is not necessarily limited to have a substantially cylindrical shape but may have any one of various shapes. Moreover, in the substrate processing apparatus 1, it is not always necessary to provide the chamber 21.

The substrate processing apparatus 1 may be used for processing a glass substrate used in a display device such as a liquid crystal display, a plasma display, an FED (Field Emission Display) or the like, other than the semiconductor substrate. Alternatively, the substrate processing apparatus 1 may be used for processing a substrate for optical disk, a substrate for magnetic disk, a substrate for magneto-optic disk, a substrate for photomask, a ceramic substrate, a substrate for solar battery, or the like.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
4 Cup part
5 Processing liquid supply part
9 Substrate
22 Top plate
24 Liquid film forming part
31 Substrate holding part
32 Substrate rotating mechanism
94 Liquid
95 Rotating liquid film
224 Upper surface (of top plate)
226 Second engagement part
242 Discharge port
314 First engagement part
412 Inner peripheral surface (of cup part)
J1 Central axis
S11 to S20 Step

The invention claimed is:

1. A substrate processing apparatus for processing a substrate, comprising:
    a substrate holding part for holding a substrate in a horizontal state;
    a substrate rotating mechanism for rotating said substrate holding part together with said substrate about a central axis oriented in a vertical direction;
    a processing liquid supply part for supplying a processing liquid onto said substrate;
    a cup part disposed around said substrate holding part, for receiving said processing liquid spattering from said substrate being rotated, by its inner peripheral surface;
    a plate having an annular disk-like shape about said central axis, disposed above said substrate, extending toward the outside of an outer peripheral edge of said substrate in a radial direction about said central axis; and
    a liquid film forming part for forming a rotating liquid film which rotates in the same direction as said substrate does, on said inner peripheral surface of said cup part, by supplying a liquid onto an upper surface of said plate rotating in the same direction as said substrate rotates about said central axis, to thereby supply said liquid from said upper surface of said plate to said inner peripheral surface of said cup part by centrifugal force, in parallel with a processing of said substrate with said processing liquid.

2. The substrate processing apparatus according to claim 1, further comprising:
    a position fixing member for fixing a relative position of said plate relative to said substrate holding part in a circumferential direction about said central axis during rotation of said plate,
    wherein said plate is rotated together with said substrate holding part by said substrate rotating mechanism.

3. The substrate processing apparatus according to claim 2, wherein
    said liquid film forming part comprises a plurality of discharge ports arranged in a circumferential direction about said central axis, each of which discharges said liquid toward said upper surface of said plate.

4. The substrate processing apparatus according to claim 3, wherein
    said liquid supplied from said liquid film forming part to said plate goes outward in a radial direction about said central axis as said liquid comes nearer to said plate.

5. The substrate processing apparatus according to claim 4, wherein
    said inner peripheral surface of said cup part has a lyophilic property to said liquid supplied from said liquid film forming part.

6. The substrate processing apparatus according to claim 5, wherein
    said upper surface of said plate has a lyophilic property to said liquid supplied from said liquid film forming part.

7. The substrate processing apparatus according to claim 1, wherein
    said liquid film forming part comprises a plurality of discharge ports arranged in a circumferential direction about said central axis, each of which discharges said liquid toward said upper surface of said plate.

8. The substrate processing apparatus according to claim 7, wherein
    said liquid supplied from said liquid film forming part to said plate goes outward in a radial direction about said central axis as said liquid comes nearer to said plate.

9. The substrate processing apparatus according to claim 8, wherein
said inner peripheral surface of said cup part has a lyophilic property to said liquid supplied from said liquid film forming part.

10. The substrate processing apparatus according to claim 9, wherein
said upper surface of said plate has a lyophilic property to said liquid supplied from said liquid film forming part.

11. The substrate processing apparatus according to claim 1, wherein
said liquid supplied from said liquid film forming part to said plate goes outward in a radial direction about said central axis as said liquid comes nearer to said plate.

12. The substrate processing apparatus according to claim 11, wherein
said inner peripheral surface of said cup part has a lyophilic property to said liquid supplied from said liquid film forming part.

13. The substrate processing apparatus according to claim 12, wherein
said upper surface of said plate has a lyophilic property to said liquid supplied from said liquid film forming part.

14. The substrate processing apparatus according to claim 1, wherein
said inner peripheral surface of said cup part has a lyophilic property to said liquid supplied from said liquid film forming part.

15. The substrate processing apparatus according to claim 14, wherein
said upper surface of said plate has a lyophilic property to said liquid supplied from said liquid film forming part.

16. The substrate processing apparatus according to claim 1, wherein
said upper surface of said plate has a lyophilic property to said liquid supplied from said liquid film forming part.

17. The substrate processing apparatus according to claim 1, wherein
said processing liquid supplied from said processing liquid supply part and said liquid supplied from said liquid film forming part are liquids of the same kind.

* * * * *